United States Patent [19]

Needham

[11] Patent Number: 5,670,384

[45] Date of Patent: Sep. 23, 1997

[54] PROCESS FOR FORMING SOLID STATE IMAGER WITH MICROLENSES

[75] Inventor: Christopher R. Needham, Beverly, Mass.

[73] Assignee: Polaroid Corporation, Cambridge, Mass.

[21] Appl. No.: 534,093

[22] Filed: Sep. 26, 1995

Related U.S. Application Data

[60] Continuation of Ser. No. 283,209, Jul. 29, 1994, abandoned, which is a division of Ser. No. 123,138, Sep. 17, 1993, abandoned.

[51] Int. Cl.$^6$ ............................................. H01L 31/18
[52] U.S. Cl. ............................................ 437/3; 216/26
[58] Field of Search ................................ 437/3; 216/26, 216/38, 72; 280/338.3, 338.4

[56] References Cited

U.S. PATENT DOCUMENTS

| | | | |
|---|---|---|---|
| 4,910,155 | 3/1990 | Cote et al. | 156/636 |
| 5,239,179 | 8/1993 | Baker | 250/338.4 |
| 5,336,367 | 8/1994 | Nomura | 156/655 |
| 5,384,231 | 1/1995 | Johnson et al. | 437/228 |

FOREIGN PATENT DOCUMENTS

| | | | |
|---|---|---|---|
| 59-90466 | 5/1984 | Japan | 257/432 |
| 59-92567 | 9/1984 | Japan | . |
| 60-47472 | 3/1985 | Japan | 257/432 |
| 60-145776 | 8/1985 | Japan | 257/432 |
| 61-32409 | 2/1986 | Japan | 257/432 |
| 61-32469 | 2/1986 | Japan | 257/432 |
| 61-287263 | 12/1986 | Japan | 257/432 |
| 61-290403 | 12/1986 | Japan | 257/432 |
| 62-12172 | 1/1987 | Japan | 257/432 |
| 62-23161 | 1/1987 | Japan | . |
| 62-92468 | 4/1987 | Japan | . |
| 63-188102 | 8/1988 | Japan | 257/432 |
| 2-65171 | 3/1990 | Japan | 257/432 |
| 4-24964 | 1/1992 | Japan | 257/432 |
| 4-25073 | 1/1992 | Japan | 257/432 |
| 4-37165 | 2/1992 | Japan | 257/432 |
| 4-322466 | 11/1992 | Japan | 257/432 |
| WO 90/13146 | 11/1990 | WIPO | . |

OTHER PUBLICATIONS

S. Wolf, "Silicon Processing for the VLSI Era, vol. 2: Process Integration", Lattice Pres, 1990, pp. 228–229.

Daly et al., The manufacture of microlenses by melting photoresist, Meas. Sci. Technol., 1, 759–766 (1990).

Isihara et al., A High Photosensitivity IL–CCD Image Sensor with Monolithic Lens Array, 1983 International Electron Devices Meeting, Technical Digest, pp. 497–500, 1983.

Patent Abstracts of Japan, 8(206), Abstract 59–92567, Published Sep. 20, 1984.

Sano et al., Submicron Spaced Lens Array Process Technology for a High Photosensitivity CCD Image Sensor, 1990 International Electron Devices Meeting, Technical Digest, pp. 283–286, 1990.

*Primary Examiner*—John Niebling
*Assistant Examiner*—Thomas G. Bilodeau
*Attorney, Agent, or Firm*—David J. Cole

[57] ABSTRACT

Microlenses are formed on a solid state imager comprising a substrate having planar radiation-sensitive regions and upstanding electrode regions by forming a conformal layer of a first, low refractive index material on the substrate, and forming a planarized layer of a second, higher refractive index material on top of the layer of first material. The portions of the second material extending down between the upstanding electrode regions act as microlenses deflecting light which would otherwise fall on the radiation-insensitive electrode regions on to the radiation-sensitive regions, thus improving the quantum efficiency of the imager.

8 Claims, 3 Drawing Sheets

PROCESS FOR FORMING SOLID STATE IMAGER WITH MICROLENSES

This is a continuation of application Ser. No. 08/283,209, filed Jul. 29, 1994 (now abandoned), which in turn is a divisional of application Ser. No. 08/123,138, filed Sep. 17, 1993, and also now abandoned.

BACKGROUND OF THE INVENTION

This invention relates to a solid state imager provided with microlenses, and to a process for forming such a solid state imager.

Solid state imagers typically comprise a substrate having substantially planar radiation-sensitive regions, and spaced electrode regions (also called "collection regions" or "storage areas"), which extend above the plane of the radiation-sensitive regions. (Herein, the words "up" and "above" are used in their conventional sense in the solid state imager art to refer to movement or distance away from the surface of the substrate carrying the radiation-sensitive regions, regardless of the orientation of the imager in space, and terms such as "upstanding" are to be construed accordingly.) Photons striking the imager create electron-hole pairs, which are collected in the electrode regions. The ratio between the number of electron-hole pairs collected and the number of photons striking the imager is termed the quantum efficiency. Designers of such imagers desire this efficiency to be as high as possible, since an increase in quantum efficiency allows the imager to work at lower light levels, or allows the size of the individual pixels to be reduced, thus improving the resolution of the imager.

Quantum efficiencies of commercial solid state imagers are typically only about 15 to 25 percent. One major factor reducing quantum efficiency is absorption of photons by the electrode regions, which are not radiation-sensitive. Accordingly, quantum efficiency can be increased by redirecting photons which would otherwise strike radiation-insensitive electrode regions so that they impinge upon the radiation-sensitive regions, and it is known to provide solid state imagers with so-called "microlenses" which redirect incoming photons from radiation-insensitive electrode regions on to radiation-sensitive regions.

In prior art processes for the formation of solid state imagers provided with microlenses, the electrodes are typically first covered with a thin conformal layer of a glass, for example a phosphosilicate or borophosphosilicate glass. (Herein, the term "conformal" is used in its conventional sense in the solid state imager art to mean a layer which is of substantially constant thickness normal to the plane of the radiation-sensitive regions, so that the upper surface of the conformal layer is of essentially the same shape as that of the structure below the conformal layer. A layer which is applied so that its upper surface is essentially planar and parallel to the plane of the radiation-sensitive regions of the substrate, notwithstanding variations in the level of the underlying structure, may hereinafter be called a "planarized" layer.) A conformal layer of silicon nitride is then applied as a passivating layer over the glass layer, and a color filter is formed over the silicon nitride layer, this color filter being substantially planar. Finally, microlenses are formed on top of the color filter. As described in, for example, Isihara et al., A High Photosensitivity II-CCD Image Sensor with Monolithic Lens Array, 1983 International Electron Devices Meeting, Technical Digest, pages 497–500, the microlenses are typically formed by applying a layer of photoresist over the color filter, exposing and developing the photoresist layer in the conventional manner to divide it into a series of cuboidal blocks lying in the desired positions above the radiation-sensitive regions, and finally melting the photoresist to form the individual blocks into substantially hemispherical microlenses, which direct light on to the radiation-sensitive regions.

Providing microlenses on the solid state imager in this manner using photoresist involves several additional steps in the production process, including application of the photoresist layer, one or more exposure steps, a developing step and the heating step to form the microlenses. At least one additional mask is required to form the desired pattern in the photoresist, and although the necessary registration of this mask with the radiation-sensitive regions of the imager is within the level of skill in the art, the need for this registration introduces another potential source of failure in the already complex process for forming the solid state imager. Furthermore, regardless of the actual technique used to form the microlenses on top of the color filter, the resultant microlenses are exposed on the outside surface of the imager, they are vulnerable to mechanical damage or contamination; it is not normally possible to apply any protective layer over the microlenses, since the ability of the microlenses to focus incident radiation on to the radiation-sensitive regions depends upon the convex interface between the upper surfaces of the microlenses and air, and applying a planarized protective layer over the microlenses would destroy this interface, because the protective layer would have a refractive index not substantially lower than that of the material (typically photoresist or resin) forming the microlenses.

Accordingly, there is a need for a process for forming microlenses on solid state imagers which does not leave the microlenses exposed on the external surface of the imager. It is desirable that such a process involve fewer additional steps than the conventional process for forming microlenses discussed above. The present invention provides such a process, and the solid state imager produced by this process.

SUMMARY OF THE INVENTION

Accordingly, this invention provides a solid state imager comprising:

a substrate having substantially planar radiation-sensitive regions and spaced electrode regions which are not radiation-sensitive and extend above the plane of the radiation-sensitive regions, a substantially conformal layer of a first material superposed on the substrate; and a layer of a second material superposed on the layer of the first material, the lower surface of the layer of second material being in contact with the conformal layer of the first material and the upper surface of the layer of second material being substantially planar and substantially parallel to the plane of the radiation-sensitive regions, the second material having a refractive index higher than that of the first material.

This invention also provides a process for forming a solid state imager, this process comprising:

providing a substrate having substantially planar radiation-sensitive regions and spaced electrode regions which are not radiation-sensitive and extend above the plane of the radiation-sensitive regions, forming a substantially conformal layer of a first material on the substrate; and forming a layer of a second material on the layer of the first material, the lower surface of the layer of second material being in contact with the conformal layer of the first material and the upper surface of the layer of second material being substantially planar and substantial parallel to the plane of the radiation-sensitive regions, the second material having a refractive index higher than that of the first material.

For convenience, the layers of first and second materials formed during the process of the present invention may hereinafter be called simply the "first" and "second" layers respectively. Also, the plane of the substantially planar radiation-sensitive regions may hereinafter be called the "substrate plane."

DETAILED DESCRIPTION OF THE INVENTION

Figure 1:
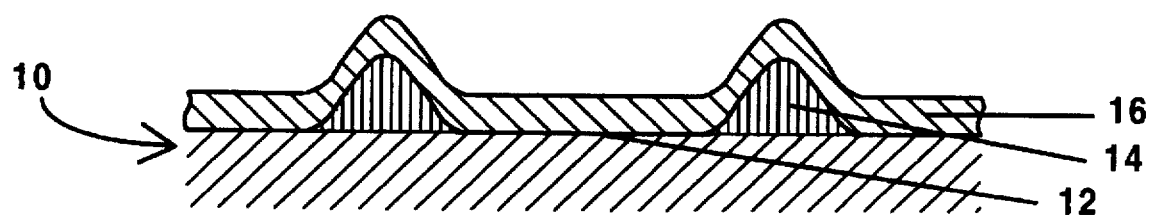
FIG. 1 of the accompanying drawings is a schematic section, taken normal to the plane of the radiation-sensitive regions, through a solid state imager prior to the application of the present process.

As already mentioned, the present process begins with a substrate having substantially planar radiation-sensitive regions and spaced electrode regions which are not radiation-sensitive and extend above the plane of the radiation-sensitive regions. Unlike the prior art processes for the formation of microlenses, as discussed above, the present process is applied to the imager before formation of a color filter thereon; as discussed in more detail below with reference to the drawings, if a color filter is required in the imager of the invention, this filter may be formed following the completion of the present process. In the first step of the present process, a substantially conformal layer of a first material is formed on the substrate. Thereafter, a planarized layer of a second material is formed on top of the first layer, this second material having a refractive index higher than that of the first material. The portions of the second layer which extend into the "valleys" of the first, conformal layer constitute the microlenses of the present imager. These microlenses will not normally be exposed on the external surface of the imager, since a passivating layer and/or a color filter is typically formed on top of the microlenses; hence, the microlenses are much less susceptible to contamination or mechanical damage than conventional microlenses which are exposed on the external surface of the imager. Furthermore, since the operation of the microlenses does not depend upon the presence of a convex interface between the microlenses and air (the converging power of the present microlenses depends upon the interface between the lower surface of the second layer and the upper surface of the first layer), any desired protective layer can be applied to the external surface of the imager to protect the imager from damage during incorporation of the imager into an imaging system, or in use. Finally, since the locations of the microlenses are automatically controlled by the upstanding portions of the first layer overlying the electrode regions, no additional mask is required to form the microlenses, and there is no possibility of forming the microlenses in the wrong locations.

The advantages of the present imager cannot be achieved simply by applying a planarized layer of a high refractive index material directly on to the substrate. As discussed in more detail below with reference to the drawings, it is necessary to space the microlenses formed in the second layer from the surface of the substrate plane in order that rays which are deflected away from electrode regions by the interface between the second and first layers travel a sufficient distance between this interface and the substrate plane so that most of these rays have left the electrode region before they reach the substrate plane. The optimum thickness of the first layer for any particular imager geometry may readily be determined empirically or by ray-tracing calculations. However, for general guidance it may be stated that in commercial solid state imagers the first layer should typically have a thickness of at least about 0.7 μm, and desirably about 1.0 μm.

The converging power of the microlenses formed in the present imager, and hence the extent to which these microlenses can deflect radiation away from the electrode regions toward the radiation-sensitive regions and thus improve the quantum efficiency of the imager, varies with the difference in refractive index ($\eta$) between the first and second materials, as may readily be seen by considering the well-known lensmakers formula. Desirably, this difference in refractive index is at least about 0.3. Conveniently, the first material is silicon dioxide ($\eta$~1.45) and the second material is silicon nitride ($\eta$~2.0); these two materials have a large difference in refractive index, and since both are routinely used in fabricating microcircuits, they are commercially available in forms ready for use in the present process.

It is common practice in the solid state imager art to form a thin layer of a glass, for example a phosphosilicate or borophosphosilicate glass, over a substrate before applying additional layers, such as color filters, to the substrate, in order to smooth the substrate, especially the electrode regions thereof. The present process may include application of such a glass layer on to the substrate before formation of the layer of first material thereon. Since glass is largely silicon dioxide, it is (at least theoretically) possible to perform the present process by depositing an unusually thick layer of glass on to the substrate, so that this thick layer acts as both the conventional glass layer and the first layer of the present process, and then to deposit the second layer directly on to the glass layer. However, most prior art techniques for the formation of the glass layer do not give glass layers thick enough, or sufficiently conformal, to act as the first layer in the present process. Accordingly, even when a glass layer is required on the substrate, it is normally desirable to practice the present process by forming a separate layer of first material on top of the glass layer, although of course where a glass layer is present below the first layer, it may be possible to reduce the thickness of the first layer.

The thickness of the second layer formed in the second process should in general be at least about equal to the difference in height between the "peaks" and "valleys" in the conformal first layer, and thus at least about equal to the difference in height between the substrate plane and the highest portions of the electrode regions; this difference is typically around 1-2 µm. In practice, however, it is usually desirable to first form a substantially conformal layer of the second material on the layer of the first material, and thereafter to remove upstanding portions of the conformal layer of the second material to render the upper surface of the layer of the second material substantial parallel to the plane of the radiation-sensitive regions. When using this technique, the conformal second layer should normally be at least about 2 µm thick. Removal of the upstanding portions of the conformal second layer may be effected by various methods, including mechanical abrasion. In a preferred method for removal of the upstanding portions, a layer of photoresist is applied to the conformal layer of second material, and thereafter this layer of photoresist and upstanding portions of the conformal layer of the second material are etched using an etching process which does not etch the photoresist substantially more quickly than the second material; desirably the etching process etches the second material at a slightly greater speed than the photoresist. The exact shape of the upper surface of the second layer following the etching depends upon the relative rates of etching of the photoresist and the second material; if the etching process etches the second material at a slightly greater speed than the photoresist, the upper surface of the second layer after etching is slightly convex upwards over the radiation-sensitive regions (see discussion of FIG. 5 below). Although in this case the upper surface of the second layer after etching is not strictly planar, the slight deviation from planarity does not affect the ability of the microlenses to increase the quantum efficiency of the imager. When silicon nitride is used as the second material, etching is conveniently effected with a sulfur hexafluoride/oxygen plasma etch.

After the microlenses have been formed in the second layer by the present process, one or more additional layers may be formed on top of the second layer. These additional layers may include a passivating layer containing "loose" hydrogen capable of migrating to the silicon substrate of the imager and repairing processing defects in this silicon. A convenient material for forming such a passivating layer is silicon nitride. If desired, a color filter may be formed using any convenient technique (see, for example, U.S. Pat. Nos. 4,808,501; 5,059,500 and 5,140,396) on either the second layer or a passivating layer superposed thereon. Finally, a protective layer, formed for example from a durable polymer, may be provided on the external surface of the imager to protect it from mechanical damage or abrasion.

A preferred process of the invention will now be described, though by way of illustration only, with reference to the accompanying drawings, to show details of particularly preferred reagents, conditions and techniques used in the present process.

FIG. 1 of the accompanying drawings is a schematic cross-section, normal to the substrate plane, through a solid state imager comprising a substrate (generally designated 10) having planar radiation-sensitive regions 12 and spaced electrode regions 14 extending above the substrate plane, these electrode regions 14 being insensitive to radiation. Both the radiation-sensitive regions 12 and the electrode regions 14 are covered by a conformal layer 16 of phosphosilicate glass approximately 1 µm thick. (It will be apparent to those skilled in the manufacture of solid state imagers that the electrode regions 14 are shown in a highly schematic manner in the drawings; typically the cross-section of the electrode regions is much more angular than shown in the drawings. However, since the process of the present invention is effected upon the layer 16 the exact cross-section of the electrode regions 14 does not affect the present process.)

Figure 2:
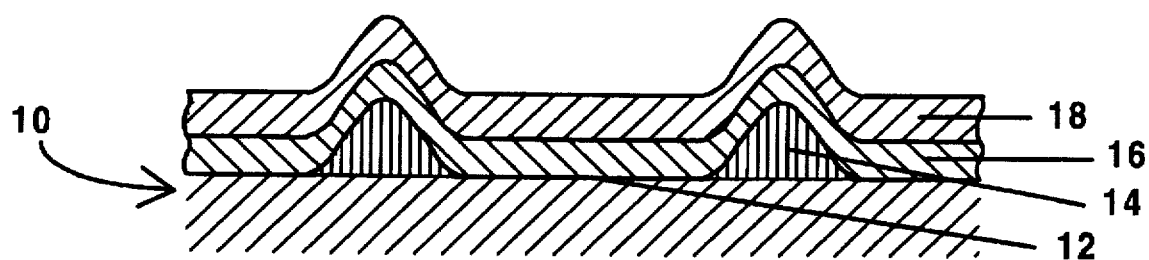
FIG. 2 is a section similar to FIG. 1 after the first layer has been applied.
Figure 3:
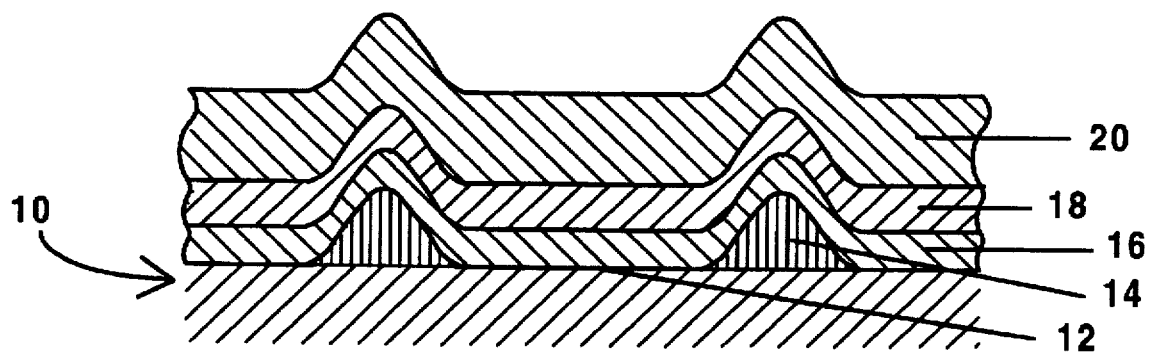
FIG. 3 is a section similar to FIG. 1 after the second layer has been applied.
Figure 4:
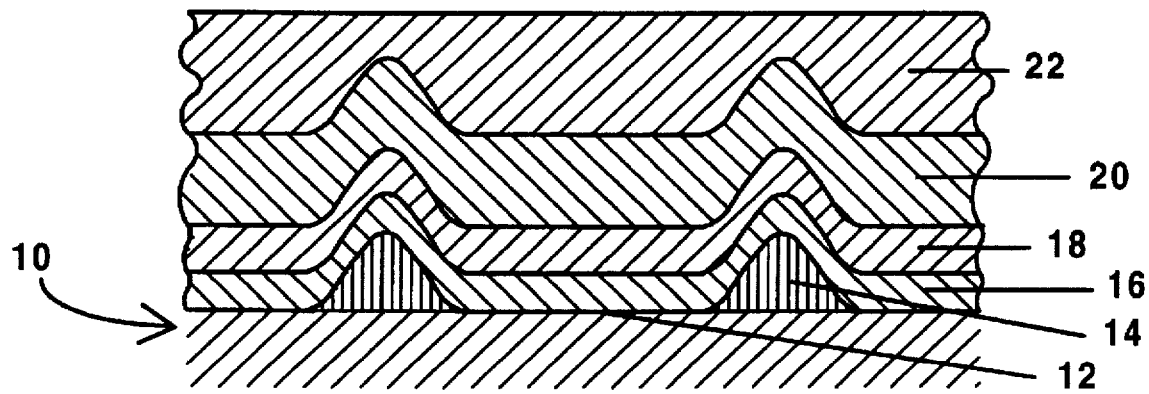
FIG. 4 is a section similar to FIG. 1 after a photoresist layer has been applied in a preferred process for planarizing the second layer.
Figure 5:
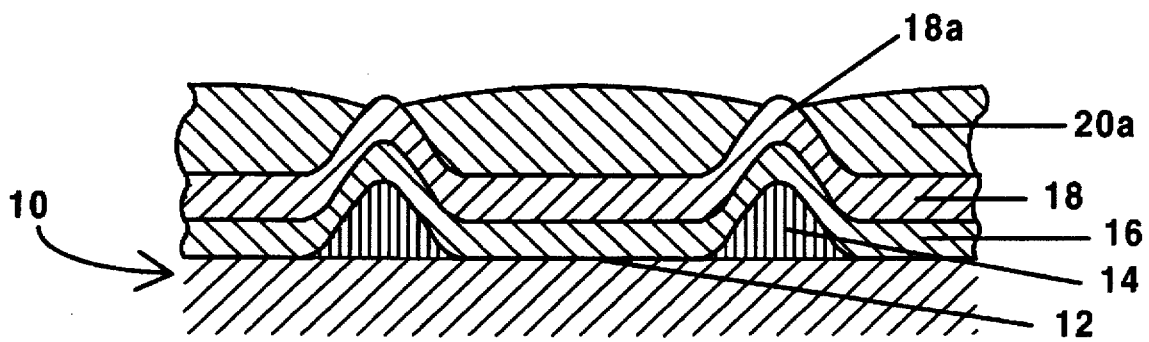
FIG. 5 is a section similar to FIG. 1 after planarization of the second layer has been effected and the microlenses formed.
Figure 6:
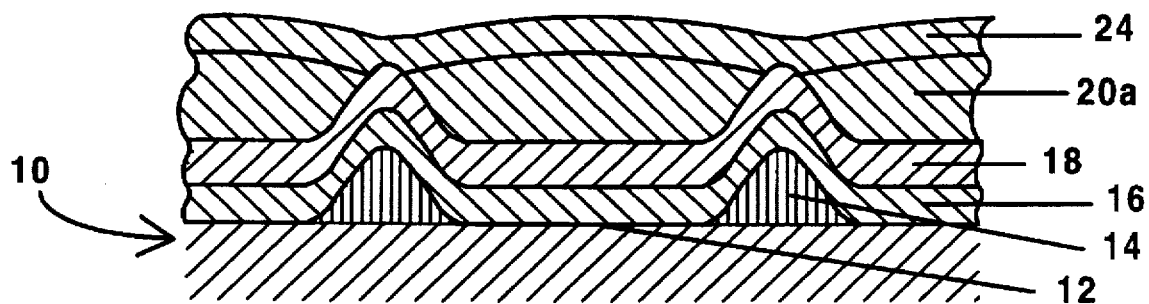
FIG. 6 is a section similar to FIG. 1 showing the finished solid state imager after application of a passivating layer.

FIG. 2 shows the substrate 10 after the first step of the present process, in which a conformal first layer 18, approximately 1 µm thick and formed of silicon dioxide ($\eta$~1.45) is deposited by plasma enhanced chemical vapor deposition (PECVD). In the second step of the present process, as shown in FIG. 3, a conformal second layer 20, approximately 2 µm thick and formed of silicon nitride ($\eta$~2.0) is deposited by PECVD on top of the first layer 18. Next, as shown in FIG. 4, a planarized layer 22 of photoresist is formed on top of the second layer 20 by spin coating. After the layer 22 has been formed, the imager is subjected to a sulfer hexafluoride/oxygen directional plasma etch. The photoresist used to form the layer 22 is chosen so that the photoresist etches slightly slower than the silicon nitride of the second layer 20, and the etching is continued until the tops of the upstanding portions 18a (FIG. 5) of the first layer 18 above the electrode regions 14 are exposed. As shown in FIG. 5, following the etching, the upper surface of the second layer 20 is generally planar but slightly convex upwards over the radiation-sensitive regions 12. The remaining portions 20a of the second layer form microlenses. In the final step of the process, as shown in FIG. 6, an essentially planarized passivating layer 24 of silicon nitride approximately 0.5 µm thick is deposited on top of the exposed portions 18a and 20a of the first and second layers 18 and 20 respectively. Additional layers, for example a color filter and a protective layer, may be formed on top of the passivating layer 24 if desired.

Figure 7:
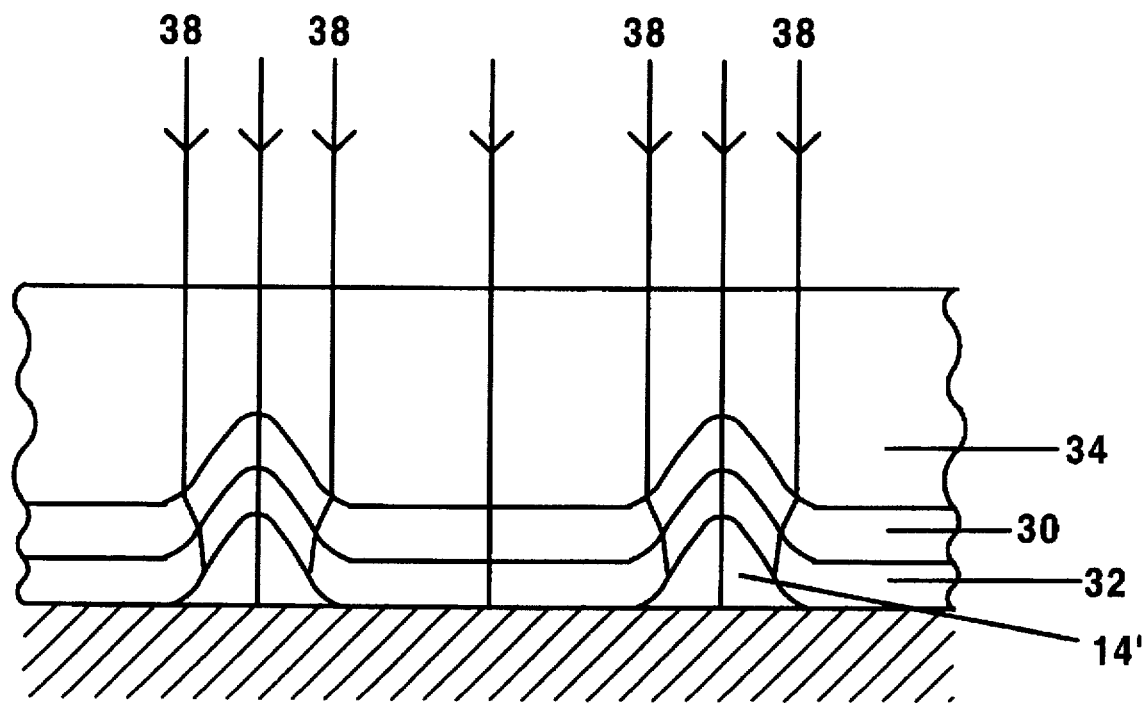
FIG. 7 is a ray tracing diagram showing the path of rays incident upon a prior art solid state imager without microlenses.
Figure 8:
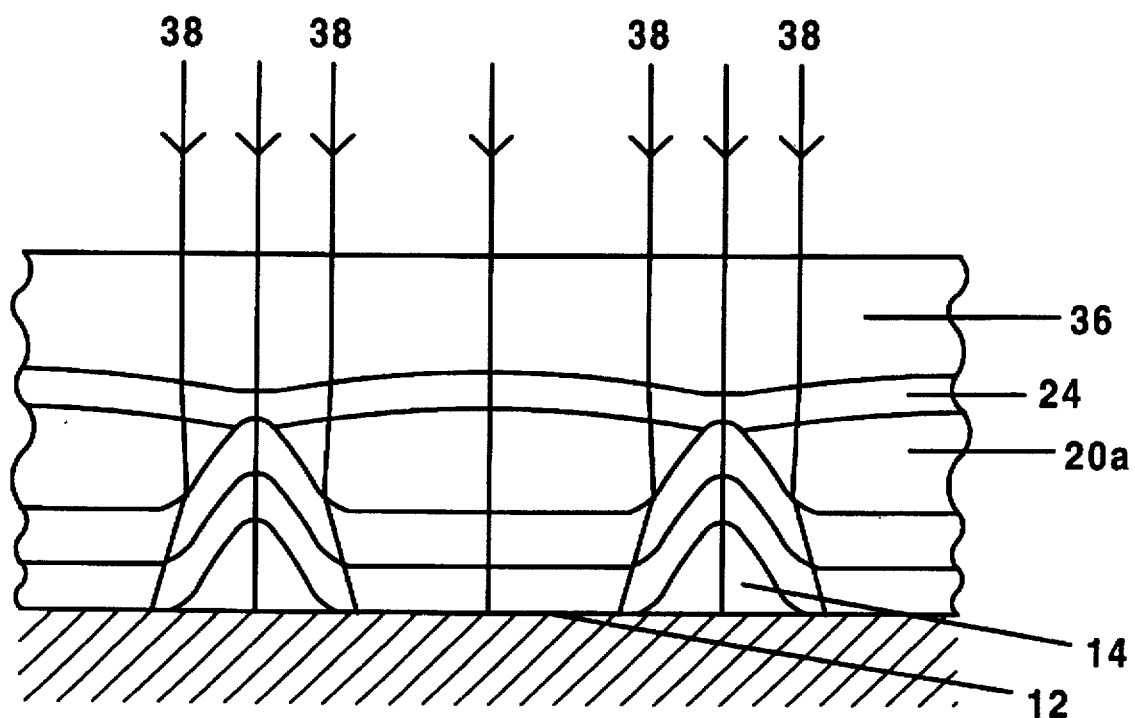
FIG. 8 is a ray tracing diagram similar to that of FIG. 7 but showing the path of rays incident upon a solid state imager of the present invention similar to that shown in FIG. 6.

FIGS. 7 and 8 are ray-tracing diagrams showing the paths of rays impinging normally on to a prior art solid state imager (in FIG. 7) and on to an imager of the present invention (in FIG. 8). For clarity, shading lines are omitted from the various layers, other than the substrates, in both FIGS. 7 and 8. The prior art imager shown in FIG. 7 is of a conventional type having a conformal passivating layer 30 of silicon nitride disposed directly on top of a conformal glass layer 32, which itself covers both the radiation-sensitive regions and the electrode regions of the substrate. A planarized color filter layer 34 is formed on top of the conformal silicon nitride layer 30. The imager of the invention shown in FIG. 8 is essentially the same as that shown in FIG. 6 except that a planarized color filter layer 36 is formed on top of the passivating layer 24.

From FIG. 7, it will be seen that rays 38 approaching perpendicular to the substrate plane adjacent the interfaces between the electrode regions and the radiation-sensitive regions are deflected inwardly toward the centers of the electrode regions 14', since the upstanding portions 30a of the conformal passivating layer 30 covering the electrode regions act as converging lens having axes passing through the centers of the electrode regions. Thus, in this prior art imager the radiation-insensitive electrode regions appear larger optically than their real physical size. In contrast, in the imager of the present invention shown in FIG. 8, the rays 38 approaching adjacent the interfaces between the electrode regions and the radiation-sensitive regions are deflected inwardly toward the centers of the radiation-sensitive regions 12, since the microlenses 20a formed in the second layer act as converging lens having axes passing through the centers of the radiation-sensitive regions. Thus, in this imager of the present invention the radiation-insensitive electrode regions appear smaller optically than their real physical size. Thus, although the imagers shown in FIGS. 7 and 8 have radiation-sensitive regions and electrode regions of the same physical size, optically the radiation-insensitive electrode regions of the prior art imager shown in FIG. 7 occupy a greater proportion of the area of the imager than do the electrode region of the imager of the invention shown in FIG. 8, and accordingly, all other factors being equal, the imager shown in FIG. 8 will have a higher quantum efficiency than that shown in FIG. 7.

From the foregoing, it will be seen that the present invention enables microlenses to be formed on a solid state imager in such a manner that the microlenses are not exposed to contamination or damage on the external surface of the imager. The present process does not require additional apparatus or a large number of additional processing steps, and uses technology familiar to those skilled in the art of fabricating microcircuits.

I claim:

1. A process for forming a solid state imager, the process comprising:

providing a substrate having substantially planar radiation-sensitive regions and spaced electrode regions which are not radiation-sensitive and extend above the plane of the radiation-sensitive regions, forming a substantially conformal layer of a first material over the substrate, said conformal layer extending across both the radiation-sensitive regions and the electrode regions of the substrate and having a thickness of at least about 0.7 μm and forming a substantially conformal layer of a second material on the layer of the first material, and thereafter removing upstanding portions of the conformal layer of the second material to render the upper surface of the layer of second material substantially parallel to the plane of the radiation-sensitive regions, thereby forming a layer of the second material having a lower surface in contact with the conformal layer of the first material and an upper surface substantially planar and substantially parallel to the plane of the radiation-sensitive regions so that the remaining portions of the layer of second material form microlenses disposed above the radiation-sensitive regions, the second material having a refractive index higher than that of the first material at a wavelength to which the radiation-sensitive regions are sensitive; and thereafter forming a color filter superposed on the remaining portions of the layer of second material, and thus leaving the upper surface of the layer second material lying substantially parallel to the plane of the radiation-sensitive regions.

2. A process according to claim 1 wherein the removal of the upstanding portions of the conformal layer of the second material is effected by mechanical abrasion.

3. A process according to claim 1 wherein the removal of the upstanding portions of the conformal layer of the second material is effected by applying a layer of photoresist to the conformal layer of the second material, and thereafter etching the layer of photoresist and the upstanding portions of the conformal layer of the second material using an etching process which does not etch the photoresist more quickly than the second material.

4. A process according to claim 1 wherein, following the formation of the microlenses but before formation of the color filter, a layer of passivating material is formed on the layer of the second material, and the color filter is formed on the layer of passivating material.

5. A process according to claim 1 wherein the second material has a refractive index at least about 0.3 greater than the refractive index of the first material at a wavelength to which the radiation-sensitive regions are sensitive.

6. A process according to claim 5 wherein the first material comprises silicon dioxide and the second material comprises silicon nitride.

7. A process according to claim 1 further comprising depositing a layer of a glass on the substrate before depositing the layer of the first material thereon.

8. A process for forming a solid state imager, the process comprising:

providing a substrate having substantially planar radiation-sensitive regions and spaced electrode regions which are not radiation-sensitive and extend above the plane of the radiation-sensitive regions, forming a substantially conformal layer of a first material over the substrate, said conformal layer extending across both the radiation-sensitive regions and the electrode regions of the substrate and having a thickness of at least about 0.7 μm; and forming a substantially conformal layer of a second material on the layer of the first material, the second material having a refractive index higher than that of the first material at a wavelength to which the radiation-sensitive regions are sensitive;

applying a layer of photoresist to the conformal layer of the second material;

etching the layer of photoresist and upstanding portions of the conformal layer of the second material using an etching process which does not etch the photoresist more quickly than the second material, thereby rendering the upper surface of the layer of second material substantially parallel to the plane of the radiation-sensitive regions, and thereby forming a layer of the second material having a lower surface in contact with the conformal layer of the first material and an upper surface substantially planar and substantially parallel to the plane of the radiation-sensitive regions so that the remaining portions of the layer of second material form microlenses disposed above the radiation-sensitive regions;

forming a layer of passivating material on the layer of the second material and thereafter forming a color filter superposed on the layer of passivating material, and thus leaving the upper surface of the layer second material lying substantially parallel to the plane of the radiation-sensitive regions.

* * * * *